(12) United States Patent
Chi et al.

(10) Patent No.: US 12,315,596 B2
(45) Date of Patent: May 27, 2025

(54) WORD LINE DRIVER, WORD LINE DRIVER ARRAY, AND SEMICONDUCTOR STRUCTURE

(71) Applicant: CHANGXIN MEMORY TECHNOLOGIES, INC., Hefei (CN)

(72) Inventors: Sungsoo Chi, Hefei (CN); Fengqin Zhang, Hefei (CN); Shuyan Jin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 183 days.

(21) Appl. No.: 18/153,420

(22) Filed: Jan. 12, 2023

(65) Prior Publication Data

US 2023/0143797 A1 May 11, 2023

Related U.S. Application Data

(63) Continuation of application No. PCT/CN2022/102649, filed on Jun. 30, 2022.

(30) Foreign Application Priority Data

Jul. 13, 2021 (CN) .......................... 202110790430.8

(51) Int. Cl.
*G11C 8/08* (2006.01)
*G11C 8/14* (2006.01)

(52) U.S. Cl.
CPC . *G11C 8/08* (2013.01); *G11C 8/14* (2013.01)

(58) Field of Classification Search
CPC ......... G11C 8/08; G11C 8/14; H01L 27/0207; H01L 27/092
See application file for complete search history.

(56) References Cited

U.S. PATENT DOCUMENTS

6,192,000 B1 2/2001 Toda
7,599,232 B2 10/2009 Miyata
(Continued)

FOREIGN PATENT DOCUMENTS

| CN | 101110263 A | 1/2008 |
| CN | 105719684 A | 6/2016 |
| CN | 109935258 A | 6/2019 |

OTHER PUBLICATIONS

International Search Report cited in PCT/CN2022/102649 mailed Aug. 26, 2022, 9 pages.

*Primary Examiner* — Sultana Begum
(74) *Attorney, Agent, or Firm* — Syncoda LLC; Feng Ma

(57) ABSTRACT

Embodiments of the present disclosure provide a word line driver, a word line driver array, and a semiconductor structure, relating to the technical field of semiconductors. The word line driver includes: a zeroth P-channel metal oxide semiconductor (PMOS) transistor, a zeroth N-channel metal oxide semiconductor (NMOS) transistor, and a first NMOS transistor, the zeroth PMOS transistor being provided with a gate connected to a gate of the first NMOS transistor and configured to receive a first control signal, a source configured to receive a second control signal, and a drain connected to a drain of the first NMOS transistor, the zeroth NMOS transistor being provided with a gate configured to receive a second control complementary signal, and a drain of the zeroth NMOS transistor and the drain of the first NMOS transistor being configured to be connected to a word line.

17 Claims, 18 Drawing Sheets

(56) References Cited

U.S. PATENT DOCUMENTS

| | | | |
|---|---|---|---|
| 9,318,175 B1* | 4/2016 | Chi | G11C 8/08 |
| 2012/0320699 A1* | 12/2012 | Noguchi | G11C 8/08 |
| | | | 365/226 |
| 2019/0189186 A1 | 6/2019 | Won et al. | |

* cited by examiner

WORD LINE DRIVER, WORD LINE DRIVER ARRAY, AND SEMICONDUCTOR STRUCTURE

CROSS-REFERENCE TO RELATED APPLICATIONS

This is a continuation of International Application No. PCT/CN2022/102649, filed on Jun. 30, 2022, which claims the priority to Chinese Patent Application No. 202110790430.8, titled "WORD LINE DRIVER, WORD LINE DRIVER ARRAY, AND SEMICONDUCTOR STRUCTURE" and filed on Jul. 13, 2021. The entire contents of International Application No. PCT/CN2022/102649 and Chinese Patent Application No. 202110790430.8 are incorporated herein by reference.

TECHNICAL FIELD

Embodiments of the present disclosure relate to, but are not limited to, a word line driver, a word line driver array, and a semiconductor structure.

BACKGROUND

While progresses have been made in science and technology, integrated circuit structures are getting more miniaturized, with smaller sizes of components and smaller spacings between adjacent components in the integrated circuit structures. The performance of some components will be reduced as the sizes are getting smaller. For example, the electrical performance of metal oxide semiconductor (MOS) transistors will be reduced with the shortening of channel lengths. At the same time, since the spacings between the adjacent components are reduced accordingly, process margins of some components arranged in the spacing are also reduced, and the fabrication difficulty of the components is increased.

SUMMARY

An overview of the subject described in detail in the present disclosure is provided below. This overview is not intended to limit the protection scope of the claims.

The embodiments of the present disclosure provide a word line driver, including: a first P-channel metal oxide semiconductor (PMOS) transistor, a first N-channel metal oxide semiconductor (NMOS) transistor, and a second NMOS transistor, the first PMOS transistor being provided with a gate connected to a gate of the second NMOS transistor and configured to receive a first control signal, a source configured to receive a second control signal, and a drain connected to a drain of the second NMOS transistor, the first NMOS transistor being provided with a gate configured to receive a second control complementary signal, and a drain of the first NMOS transistor and the drain of the second NMOS transistor being configured to be connected to a word line; wherein the word line is provided with a first extension direction, and the first PMOS transistor, the first NMOS transistor, and the second NMOS transistor are arranged side by side in the first extension direction.

The embodiments of the present disclosure also provide a word line driver array, including: at least two of the word line drivers as described above marked as a first word line driver and a second word line driver, the first word line driver including a second PMOS transistor, a third NMOS transistor, and a fourth NMOS transistor, the second word line driver including a fourth PMOS transistor, a fifth NMOS transistor, and an sixth NMOS transistor, and the first word line driver and the second word line driver being arranged side by side in a first extension direction; wherein a gate of the second PMOS transistor is connected to a gate of the fourth PMOS transistor and located on a first straight line parallel to the first extension direction, a gate of the fourth NMOS transistor is connected to a gate of the sixth NMOS transistor and located on the first straight line, and a gate of the third NMOS transistor and a gate of the fifth NMOS transistor are arranged in parallel.

The embodiments of the present disclosure also provide a semiconductor structure, including: at least two of the word line driver arrays as described above marked as a first word line driver array and a second word line driver array, the first word line driver array and the second word line driver array being arranged side by side in a second extension direction; wherein the first word line driver array includes a eleventh NMOS transistor, a twelfth NMOS transistor, a thirteenth NMOS transistor, and a fourteenth NMOS transistor; the second word line driver array includes a fifteenth NMOS transistor, a sixteenth NMOS transistor, a seventeenth NMOS transistor, and a eighteenth NMOS transistor; a gate of the eleventh NMOS transistor is connected to a gate of the fifteenth NMOS transistor and located on a first straight line; a gate of the twelfth NMOS transistor is connected to a gate of the sixteenth NMOS transistor and located on a second straight line; a gate of the thirteenth NMOS transistor is connected to a gate of the seventeenth NMOS transistor and located on a third straight line; a gate of the fourteenth NMOS transistor is connected to a gate of the eighteenth NMOS transistor and located on a fourth straight line; and the first straight line, the second straight line, the third straight line, and the fourth straight line are provided with the second extension direction and parallel to each other.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
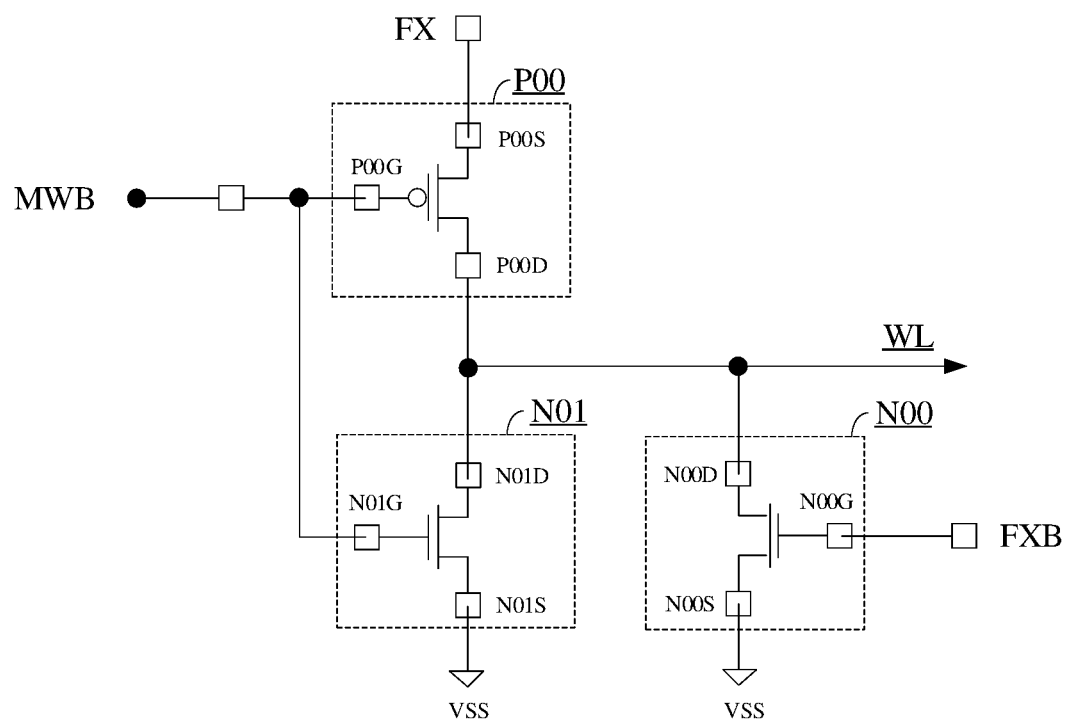
FIG. 1 is a schematic diagram of a circuit structure of a word line driver.
Figure 2:
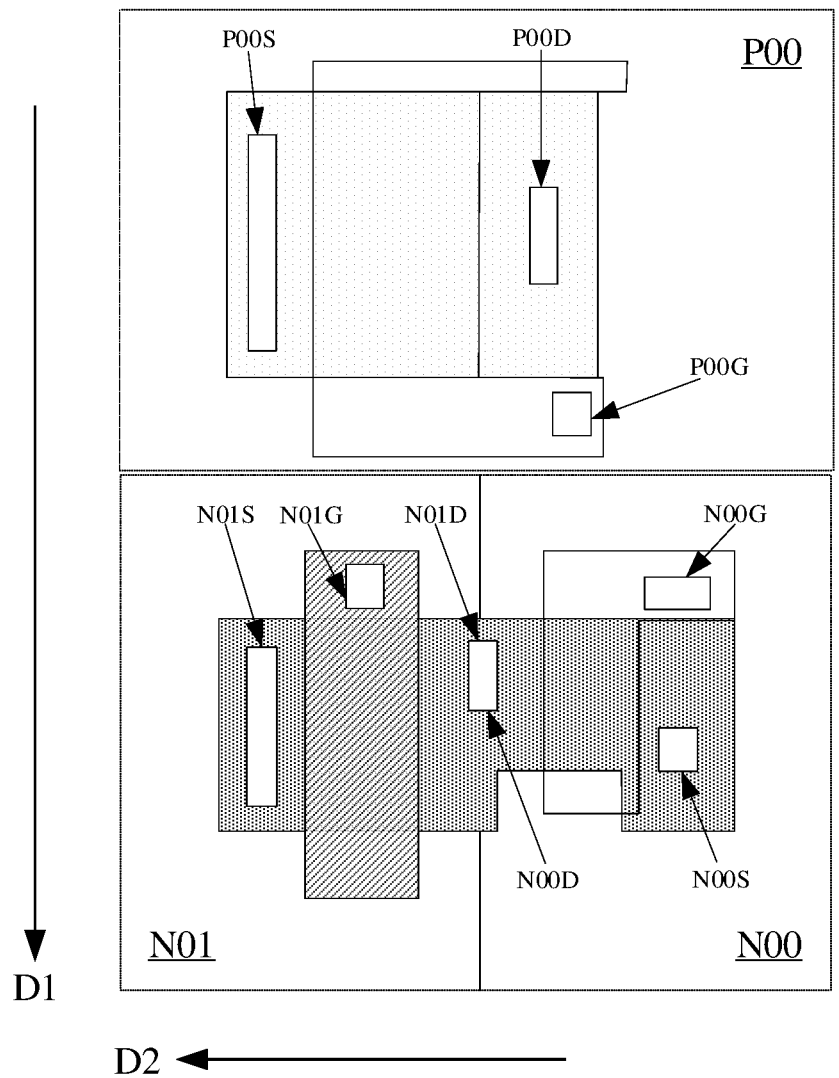
FIG. 2 is a schematic diagram of a layout of a word line driver.

Referring to FIG. 1, FIG. 1 is a schematic diagram of a circuit of a word line driver. The word line driver includes: a first PMOS transistor P00, a first NMOS transistor N00, and a second NMOS transistor N01, the first PMOS transistor P00 being provided with a gate P00G connected to a gate N01G of the second NMOS transistor N01 and configured to receive a first control signal MWB, a source P00S configured to receive a second control signal FX, and a drain P00D connected to a drain N01D of the second NMOS transistor N01, the first NMOS transistor N00 being provided with a gate N00G configured to receive a second control complementary signal FXB, a drain N00D of the first NMOS transistor N00 and the drain N01D of the second NMOS transistor N01 being configured to be connected to a word line WL, and a source N00S of the first NMOS transistor N00 and a source N01S of the second NMOS transistor N01 being connected to a low level VSS. Referring to FIG. 2, FIG. 2 is a schematic diagram of a layout of a word line driver. The first PMOS transistor P00 and the second NMOS transistor N01 are arranged side by side in a first extension direction D1, the second NMOS transistor N01 and the first NMOS transistor N00 are arranged side by side in a second extension direction D2, and the first extension direction D1 is perpendicular to the second extension direction D2.

With the miniaturization of the word line driver, the channel length of the first NMOS transistor N00 and the channel length of the second NMOS transistor N01 are gradually shortened, which will affect the reliability of the NMOS transistors. However, since the second NMOS transistor N01 and the first NMOS transistor N00 are arranged side by side in the second extension direction D2, and the channel direction of the first NMOS transistor N00 and the channel direction of the second NMOS transistor N01 are both the second extension direction D2, the channel length of single NMOS transistor is limited. Therefore, the corresponding performance cannot be improved by extending the channel length of the first NMOS transistor N00 and the channel length of the second NMOS transistor N01.

Figure 3:
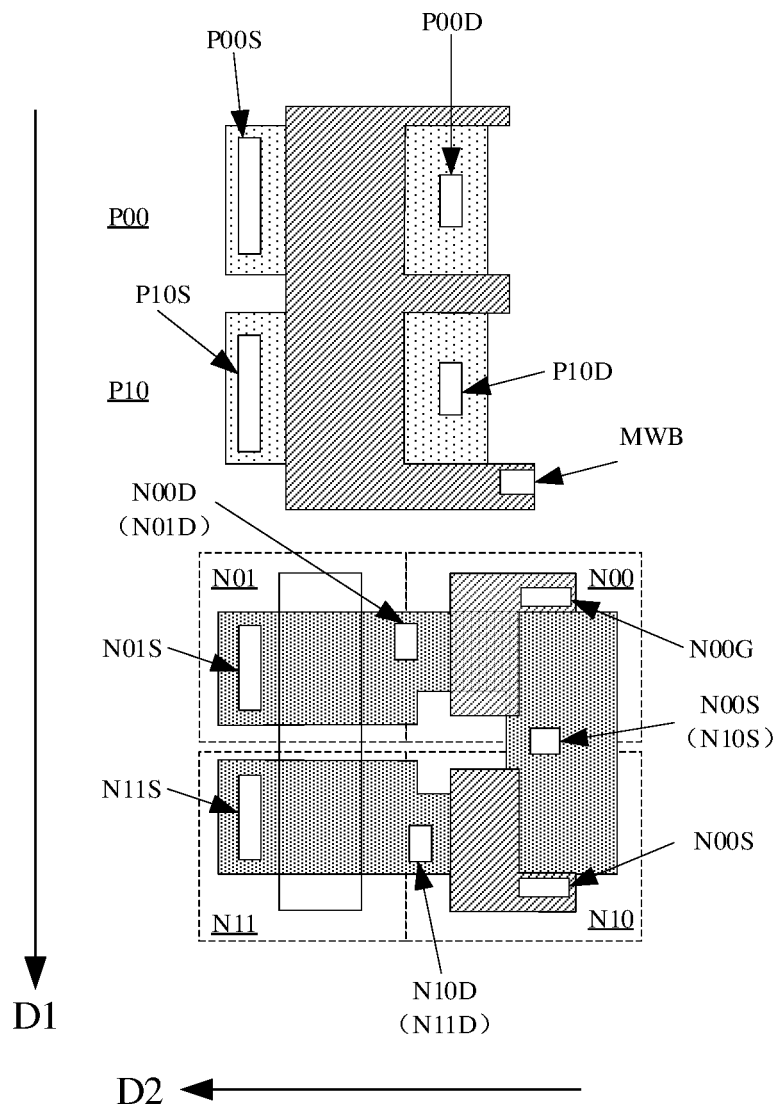
FIG. 3 to FIG. 5 are schematic diagrams of a layout of a word line driver array.

Referring to FIG. 3, FIG. 3 is a schematic diagram of a layout of a word line driver array. The word line driver array includes a second PMOS transistor P00, a fourth PMOS transistor P10, a third NMOS transistor N00, a fourth NMOS transistor N01, a fifth NMOS transistor N10, and an sixth NMOS transistor N11, where, a drain N00D of the third NMOS transistor N00 and a drain N10D of the fifth NMOS transistor N10 are arranged side by side in the first extension direction D1, the drain N00D of the third NMOS transistor N00 and a drain N01D of the fourth NMOS transistor N01 share a same metal contact marked as a first metal contact, and the drain N10D of the fifth NMOS transistor N10 and a drain N11D of the sixth NMOS transistor N11 share a same metal contact marked as a second metal contact.

There are two NMOS transistors arranged side by side in the second extension direction D2. Therefore, the size of single NMOS transistor is limited, and the spacing between gates of different NMOS transistors is narrow. The first metal contact and the second metal contact are located between the adjacent gates in the second extension direction D2. Therefore, the range of optional positions of the first metal contact and the second metal contact in the second extension direction D2 is limited by the spacing between the adjacent gates. Moreover, the spacing between the gates is narrow. Therefore, the spacing between the first metal contact and the second metal contact in the second extension direction D2 is narrow. When the first metal contact and the second metal contact are controlled to be in contact with and connect the corresponding word lines, the word lines are provided with the first extension direction D1, and the spacing between the first metal contact and the second metal contact in the second extension direction D2 is narrow. Therefore, electric isolation between the adjacent word lines can be ensured by bending the word lines. The bending of the word lines is not beneficial to improve the layout regularity of the semiconductor device, or even possibly affects the electric performance of the word lines.

Figure 4:
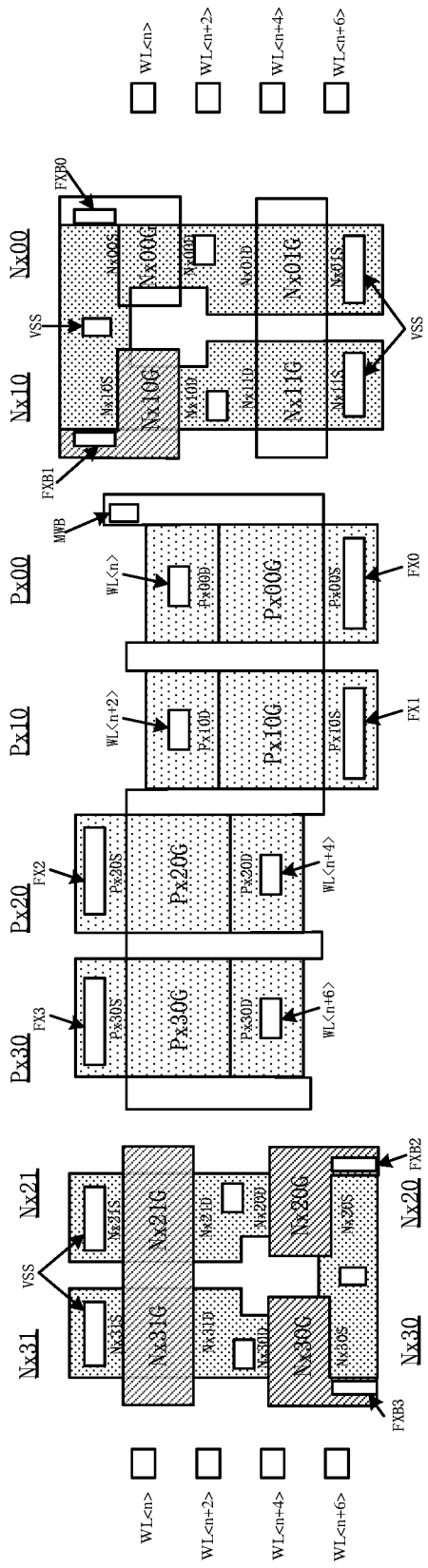
Figure 5:
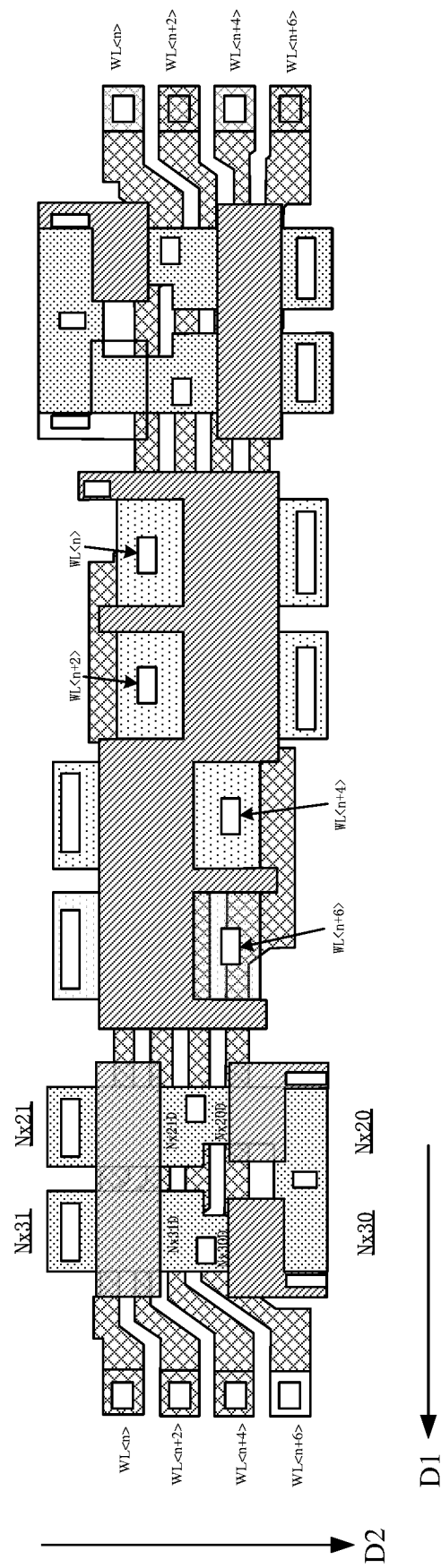
Figure 6:
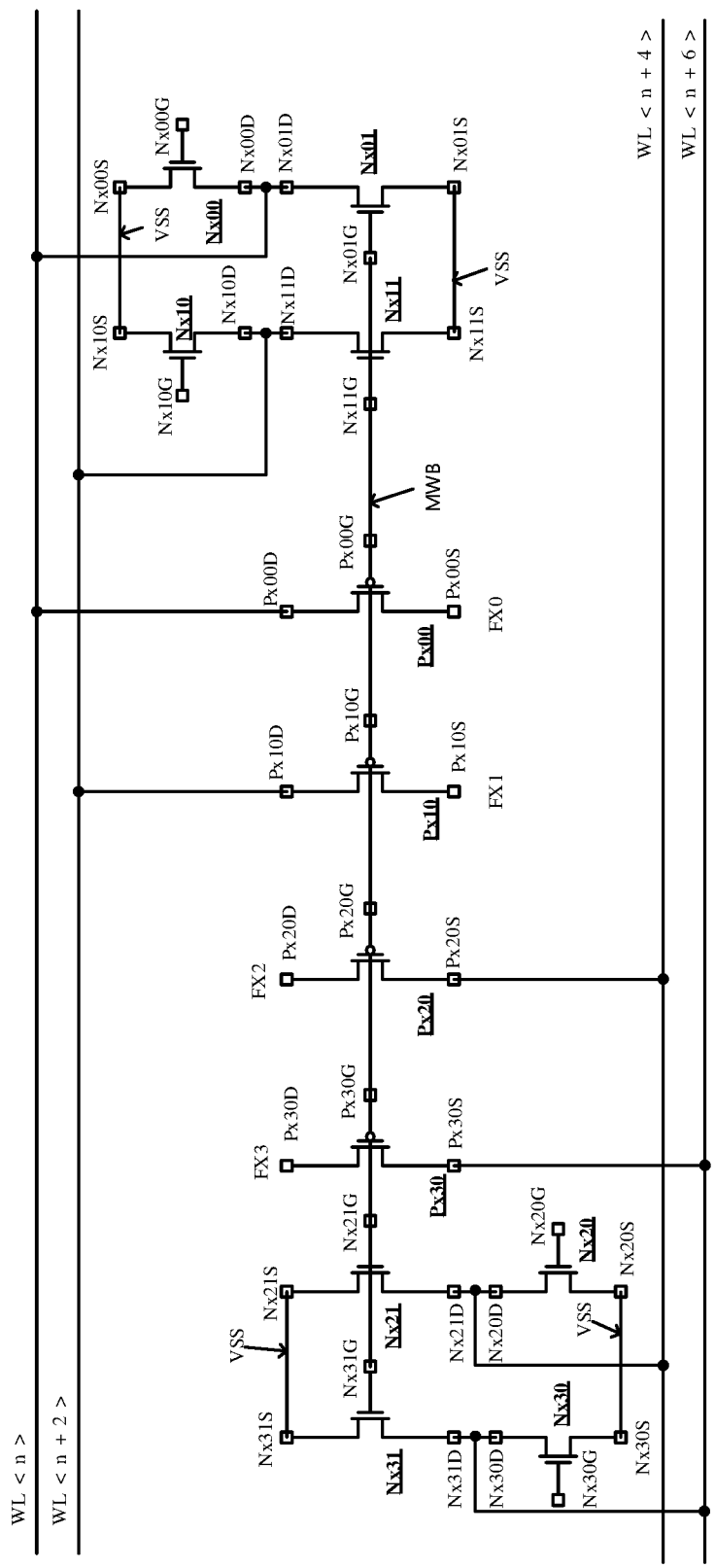
FIG. 6 is a schematic diagram of a circuit structure of a word line driver array shown in FIG. 5.

Referring to FIG. 4 to FIG. 6, FIG. 4 and FIG. 5 are schematic diagrams of a layout of a word line driver array, FIG. 6 is a schematic diagram of a circuit of a word line driver array, and FIG. 4 differs from FIG. 5 in that FIG. 5 additionally shows the word lines. A first word line WL<n> is configured to connect a drain Px00D of a second PMOS transistor Px00, a drain Nx00D of a third NMOS transistor Nx00, and a drain Nx01D of a fourth NMOS transistor Nx01 in the first word line driver. A second word line WL<n+2> is configured to connect a drain Px10D of a third PMOS transistor Px10, a drain Nx10D of a fifth NMOS transistor Nx10, and a drain Nx11D of a sixth NMOStransistor Nx11 in the second word line driver. A third word line WL<n+4> is configured to connect a drain Px20D of a fourth PMOS transistor Px20, a drain Nx20D of a seventh PMOS transistor Nx20, and a drain Nx21D of a eighth NMOS transistor Nx21 in the third word line driver. A fourth word line WL<n+6> is configured to connect a drain Px30D of a fifth PMOS transistor Px30, a drain Nx30D of a ninth NMOS transistor Nx30, and a drain Nx31D of a tenth NMOS transistor Nx31 in the fourth word line driver.

In addition, each word line driver is configured to receive the corresponding second control signal FX and second control complementary signal FXB. FIG. 4 shows a plurality of second control signals FX, namely FX0, FX1, FX2, and FX3, and shows a plurality of second control complementary signals FXB, namely FXB0, FXB1, FXB2, and FXB3.

It can be known from FIG. 5 that the drain Nx30D of the x30-th NMOS transistor Nx30 and the drain Nx31D of the tenth NMOS transistor Nx31 are connected and share a same metal contact marked as a third metal contact, and the drain Nx20D of the seventh NMOStransistor Nx20 and the drain Nx21D of the eighth NMOS transistor Nx21 are connected and share a same metal contact marked as a fourth metal contact. When the third metal contact is connected to the fourth word line WL<n+6>, and the fourth metal contact is connected to the third word line WL<n+4>, it is impossible to respectively connect the third metal contact and the fourth metal contact with different straight and parallel word lines, and it is necessary to additionally bend the third word line WL<n+4> and the fourth word line WL<n+6>. In addition, taking the third metal contact as an example, since the optional position range of the third metal contact in the second extension direction D2 is narrow, the spacing between the third metal contact and a metal contact of the drain of the corresponding PMOS transistor in the second extension direction D2 may be large, and a same word line also needs to be bent when being connected to a different metal contact, which is not beneficial to promote the layout regularity of the semiconductor device and improve the electric performance of the word line.

To make the objectives, technical solutions and advantages of the embodiments of the present disclosure clearer, the embodiments of the present disclosure are described below with reference to the accompanying drawings.

It should be noted that, each MOS transistor is provided with a corresponding gate, source and drain. For the clarity of the illustration and the brevity of the description, each gate, source and drain are identified in the illustration herein. However, each gate, source and drain are not specifically described in the description, but reference numerals are publicly described by explaining naming rules of the reference numerals. The naming rules are applicable to the whole text, that is to say, all the reference numerals that may be applicable to explanation rules are deemed to have been described in the description.

Taking Px00G as an example, the first bit from right to left indicates the polarity of the transistor, G indicates the gate, S indicates the source, and D indicates the drain. The second bit indicates the number of the same type of transistor in each word line driver. Herein, each word line driver includes one PMOS transistor and two NMOS transistors. Therefore, the value of this bit is 0 or 1, 0 indicates the first NMOS transistor or the first PMOS transistor, and 1 indicates the second NMOS transistor. The third bit indicates the number of word line driver in the word line driver array. The word line driver array includes a plurality of word line drivers, 0 indicates the first word line driver, 1 indicates the second word line driver, and 2 indicates the third word line driver, and 3 indicates the fourth word line driver. The fourth bit indicates the number of word line driver array in the semiconductor structure, and the semiconductor structure includes a plurality of word line driver arrays. If there are a plurality of arrays in the illustration, x may be set to different natural numbers (starting from 0) to identify different arrays. If there is only one array in the illustration, the fourth bit may be set to 0 or omitted directly. The last bit indicates the type of the transistor; if it is "P", it is a PMOS transistor; and if it is "N", it is an NMOS transistor.

Figure 7:
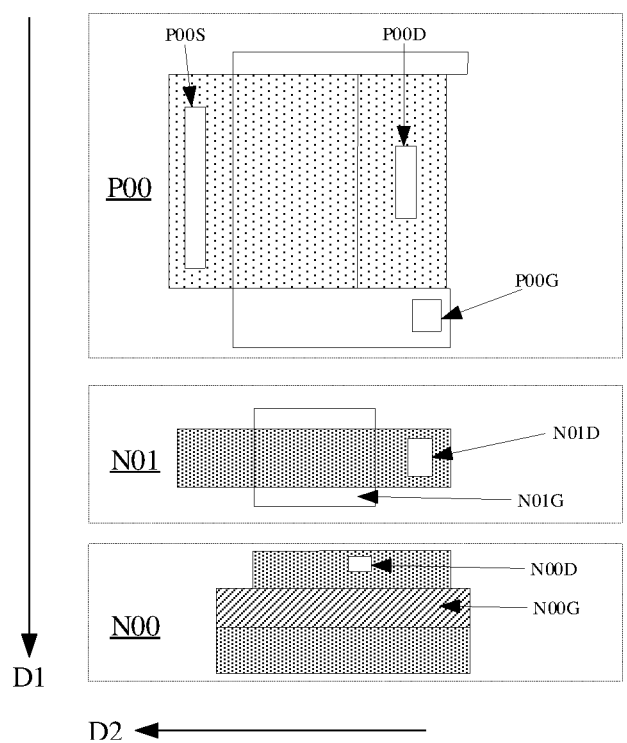
FIG. 7 is a schematic diagram of a layout of a word line driver according to an embodiment of the present disclosure.

Referring to FIG. 1 and FIG. 7, the word line driver includes: a first PMOS transistor P00, a first NMOS transistor N00, and a second NMOS transistor N01, the first PMOS transistor P00 being provided with a gate P00G connected to a gate N01G of the second NMOS transistor N01 and configured to receive a first control signal MWB, a source P00S configured to receive a second control signal FX, and a drain P00D connected to a drain N01D of the second NMOS transistor N01, the first NMOS transistor N00 being provided with a gate N00G configured to receive a second control complementary signal FXB, and a drain N00D of the first NMOS transistor N00 and the drain N01D of the second NMOS transistor N01 being configured to be connected to a word line WL. The word line WL is provided with a first extension direction D1, and the first PMOS transistor P00, the first NMOS transistor N00, and the second NMOS transistor N01 are arranged side by side in the first extension direction D1.

The first NMOS transistor N00 and the second NMOS transistor N01 are arranged side by side in the first extension direction D1. Therefore, in a second extension direction D2 perpendicular to the first extension direction D1, there is only one NMOS transistor arranged independently, thus facilitating enlarging the size range of the first NMOS transistor N00 and the second NMOS transistor N01 in the second extension direction D2. Under overall miniaturization of the word line driver, if the channel direction of the first NMOS transistor N00 and the channel direction of the second NMOS transistor N01 are the second extension direction D2, the reliability of the NMOS transistors may be promoted by extending the channel length of the first NMOS transistor N00 and the channel length of the second NMOS transistor N01.

In some embodiments, the channel of the first PMOS transistor P00 and the channel of the second NMOS transistor N01 are provided with the second extension direction D2. In this way, it is beneficial to extend the channel length of the first PMOS transistor P00 and the channel length of the second NMOS transistor N01, and promote the electric performance of the first PMOS transistor P00 and the electric performance of the second NMOS transistor N01.

In some embodiments, the channel of the first NMOS transistor N00 is provided with the first extension direction D1. In this way, the gate N00G and the drain N00D of the first NMOS transistor N00 are provided with the second extension direction D2. By extending the length of the drain N00D of the first NMOS transistor N00 in the second extension direction D2, the optional position range of the metal contact of the drain N00D in the second extension direction D2 may be enlarged, and the vertical spacing between the drain N00D of the first NMOS transistor N00 and the drain N01D of the second NMOS transistor N01 in the second extension direction D2 may be reduced, thereby reducing the bending degree of the word line connected to the drain N00D of the first NMOS transistor N00 and the drain N01D of the second NMOS transistor N01, and promoting the regularity of the word line.

In some embodiments, the first PMOS transistor P00 is located between the first NMOS transistor N00 and the second NMOS transistor N01. In some other embodiments, the second NMOS transistor N01 is located between the first NMOS transistor N00 and the first PMOS transistor P00. That is to say, the first NMOS transistor N00 whose channel is provided with the first extension direction D1 cannot be located at the middle position, or should be located at the edge position. In this way, since the width of the first NMOS transistor N00 in the second extension direction D2 is large, when the word line is not bent, a word line connecting point located outside the word line driver has a large optional position range, thereby facilitating promoting the regularity of the word line.

In some embodiments, one side edge of the drain N00D of the first NMOS transistor N00 is flush with one side edge of the drain N01D of the second NMOS transistor N01 distant from the gate N01G. In this way, the word line connected to the drain P00D of the first PMOS transistor P00 and the drain N01D of the second NMOS transistor N01 is connected to the drain N00D of the first NMOS transistor N00 when being not bent or less bent, thereby promoting the regularity of the word line and the electric performance of the word line.

In some embodiments, in the second extension direction D2, the width of the drain N00D of the first NMOS transistor N00 is equal to the sum of a width of the gate N01G of the second NMOS transistor N01 and a width of the drain N01D of the second NMOS transistor N01, and the other side edge of the drain N00D of the first NMOS transistor N00 is flush with one side edge of the gate N01G of the second NMOS transistor N01 distant from the drain N01D.

In this embodiment, the first PMOS transistor P00, the first NMOS transistor N00, and the second NMOS transistor N01 are arranged side by side, thereby facilitating enlarging the channel length range of the first NMOS transistor N00 and the second NMOS transistor N01. Thus, under gradual miniaturization of the word line driver, it is ensured that the first NMOS transistor N00 and the second NMOS transistor N01 each have a large channel length, thereby ensuring that the first NMOS transistor N00 and the second NMOS transistor N01 have higher reliability.

Figure 8:
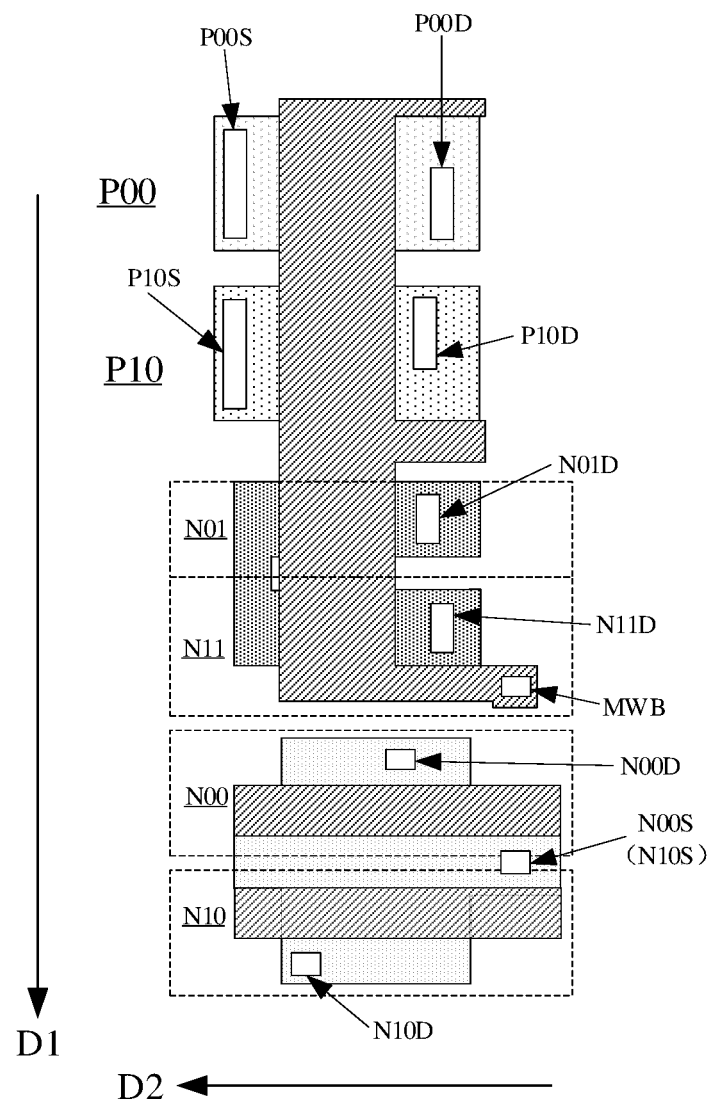
FIG. 8 to FIG. 10 are schematic diagrams of a layout of a word line driver array according to an embodiment of the present disclosure.

The embodiments of the present disclosure also provide a word line driver array. Referring to FIG. 8, the word line driver array includes: at least two of the word line drivers as described above marked as a first word line driver and a second word line driver. The first word line driver includes a second PMOS transistor P00, a third NMOS transistor N00, and a fourth NMOS transistor N01. The second word line driver includes a fourth PMOS transistor P10, a fifth NMOS transistor N10, and an sixth NMOS transistor N11. The first word line driver and the second word line driver are arranged side by side in a first extension direction D1. A gate P00G of the second PMOS transistor P00 is connected to a gate P10G of the fourth PMOS transistor P10 and located on a first straight line parallel to the first extension direction D1, a gate N01G of the fourth NMOS transistor N01 is connected to a gate N11G of the sixth NMOS transistor N11 and located on the first straight line, and a gate N00G of the third NMOS transistor N00 and a gate N10G of the fifth NMOS transistor N10 are arranged in parallel.

In some embodiments, the source N00S of the third NMOS transistor N00 is connected to the source N10S of the fifth NMOS transistor N10, and the source of the fourth NMOS transistor N01 is connected to the source of the sixth NMOS transistor N11. In some other embodiments, the gate of the fourth PMOS transistor P10 is connected to the gate of the fourth NMOS transistor N01. In the first extension direction D1, the projection of the gate of the second PMOS transistor P00, the projection of the gate of the fourth PMOS transistor P10, the projection of the gate of the fourth NMOS transistor N01, and the projection of the gate of the sixth NMOS transistor N11 overlap. That is to say, the gates do not need to be bent in the first extension direction D1.

In some embodiments, the channel of the third NMOS transistor N00 and the channel of the fifth NMOS transistor N10 are provided with the first extension direction D1. In the first extension direction D1, the orthographic projection of the drain N00D of the third NMOS transistor N00 overlaps with the orthographic projection of the drain N10D of the fifth NMOS transistor N10. Furthermore, one side edge of the drain N00D of the third NMOS transistor N00, one side edge of the drain N10D of the fifth NMOS transistor N10, one side edge of the drain N01D of the fourth NMOS transistor N01, and one side edge of the drain N11D of the sixth NMOS transistor N11 are located on a same straight line. Correspondingly, the other side of the drain N00D of the third NMOS transistor N00, the other side of the drain N10D of the fifth NMOS transistor N10, the side edge of the gate of the fourth NMOS transistor N01 distant from the drain N01D, and the side edge of the gate of the sixth NMOS transistor N11 distant from the drain N11D are located on a same straight line.

Figure 9:
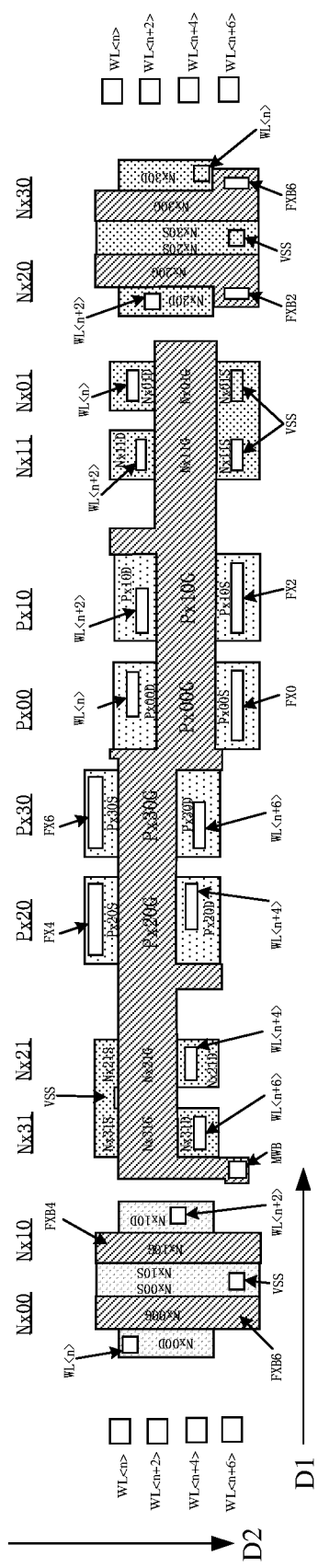
Figure 10:
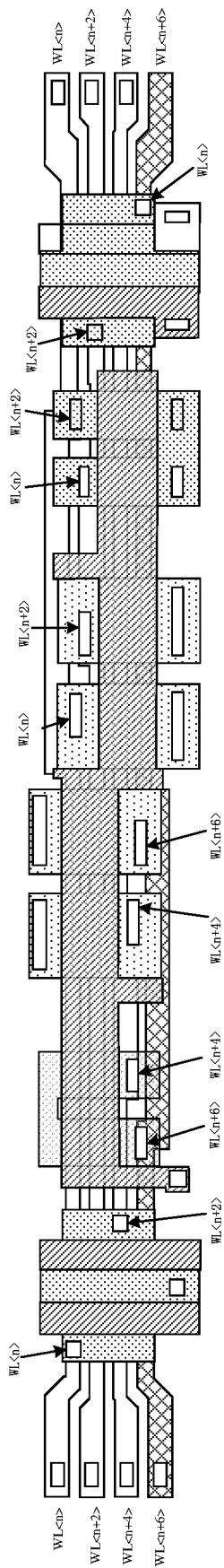
Figure 11:
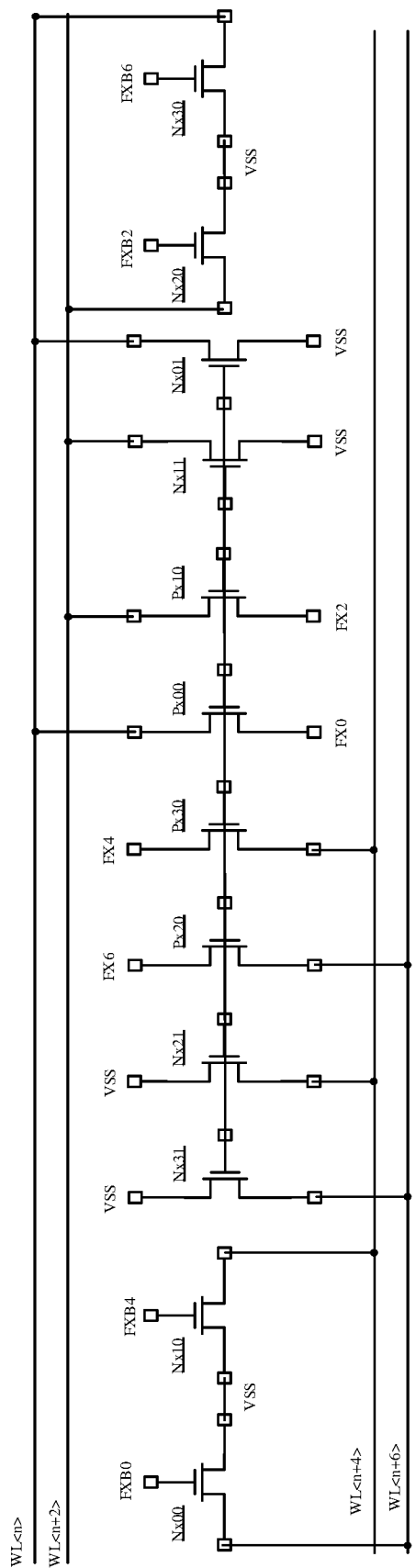
FIG. 11 is a schematic diagram of a circuit structure of a word line driver array shown in FIG. 10.

In some embodiments, referring to FIG. 9 to FIG. 11, FIG. 9 and FIG. 10 are schematic diagrams of a layout of a word line driver array according to an embodiment of the present disclosure, and FIG. 11 is a schematic diagram of a circuit structure in a layout shown in FIG. 10. FIG. 10 differs from FIG. 9 in that FIG. 10 shows the word line. The word line driver array further includes: a third word line driver including a fourth PMOS transistor Px20, a seventh NMOS transistor Nx20, and a eighth NMOS transistor Nx21; and a fourth word line driver including a fifth PMOS transistor Px30, a ninth NMOS transistor Nx30, and a tenth NMOS transistor Nx31. In the first extension direction, the third NMOS transistor Nx00, the fifth NMOS transistor Nx10, the tenth NMOS transistor Nx31, the eighth NMOS transistor Nx21, the fourth PMOS transistor Px20, the fifth PMOS transistor Px30, the second PMOS transistor Px00, the fourth PMOS transistor Px10, the sixth NMOS transistor Nx11, the fourth NMOS transistor Nx01, the seventh NMOS transistor Nx20, and the ninth NMOS transistor Nx30 are arranged side by side.

In addition, each word line driver is configured to receive the corresponding second control signal FX and second control complementary signal FXB. FIG. 4 includes a plurality of second control signals FX, namely FX0, FX2, FX4, and FX6, and includes a plurality of second control complementary signals FXB, namely FXB0, FXB2, FXB4, and FXB6.

In some embodiments, the channel of the seventh NMOS transistor Nx20 and the channel of the ninth NMOS transistor Nx30 are provided with the first extension direction D1, and in the first extension direction D1, the orthographic projection of the drain Nx00D of the third NMOS transistor Nx00, the orthographic projection of the drain Nx10D of the fifth NMOS transistor Nx10, the orthographic projection of the drain Nx20D of the seventh NMOS transistor Nx20, and the orthographic projection of the drain Nx30D of the ninth NMOS transistor Nx30 overlap.

Figure 12:
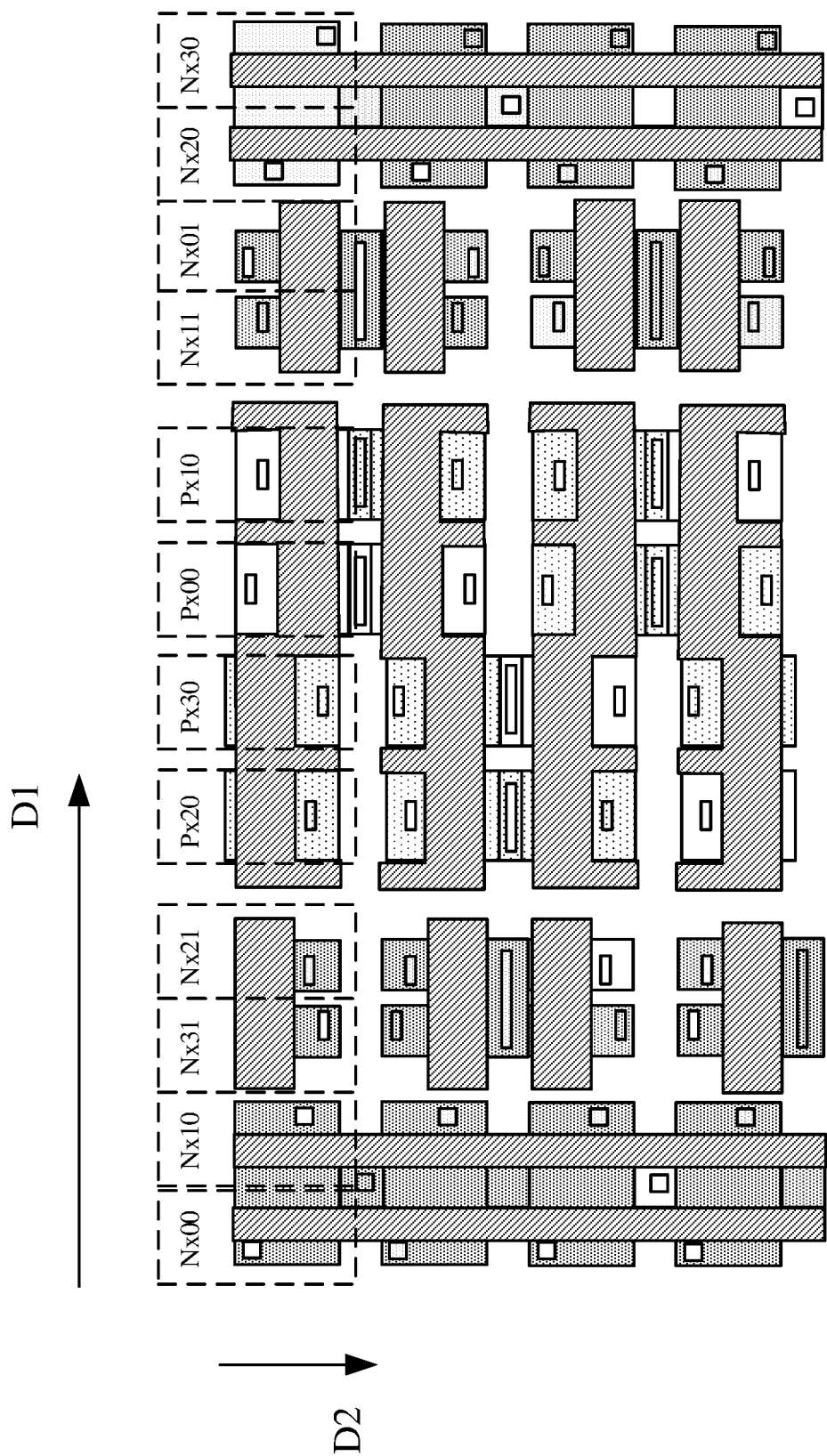
FIG. 12 to FIG. 18 are schematic diagrams of a layout of a semiconductor structure according to an embodiment of the present disclosure.

In some embodiments, referring to FIG. 12, in the first extension direction D1, the third NMOS transistor Nx00, the fifth NMOS transistor Nx10, the tenth NMOS transistor Nx31, the eighth NMOS transistor Nx21, the fourth PMOS transistor Px20, the fifth PMOS transistor Px30, the second PMOS transistor Px00, the fourth PMOS transistor Px10, the sixth NMOS transistor Nx11, the fourth NMOS transistor Nx01, the seventh NMOS transistor Nx20, and the ninth NMOS transistor Nx30 are arranged in sequence. Moreover, a plurality of word line drivers having the same arrangement are arranged side by side in the second extension direction D2 to constitute the semiconductor structure.

Figure 13:
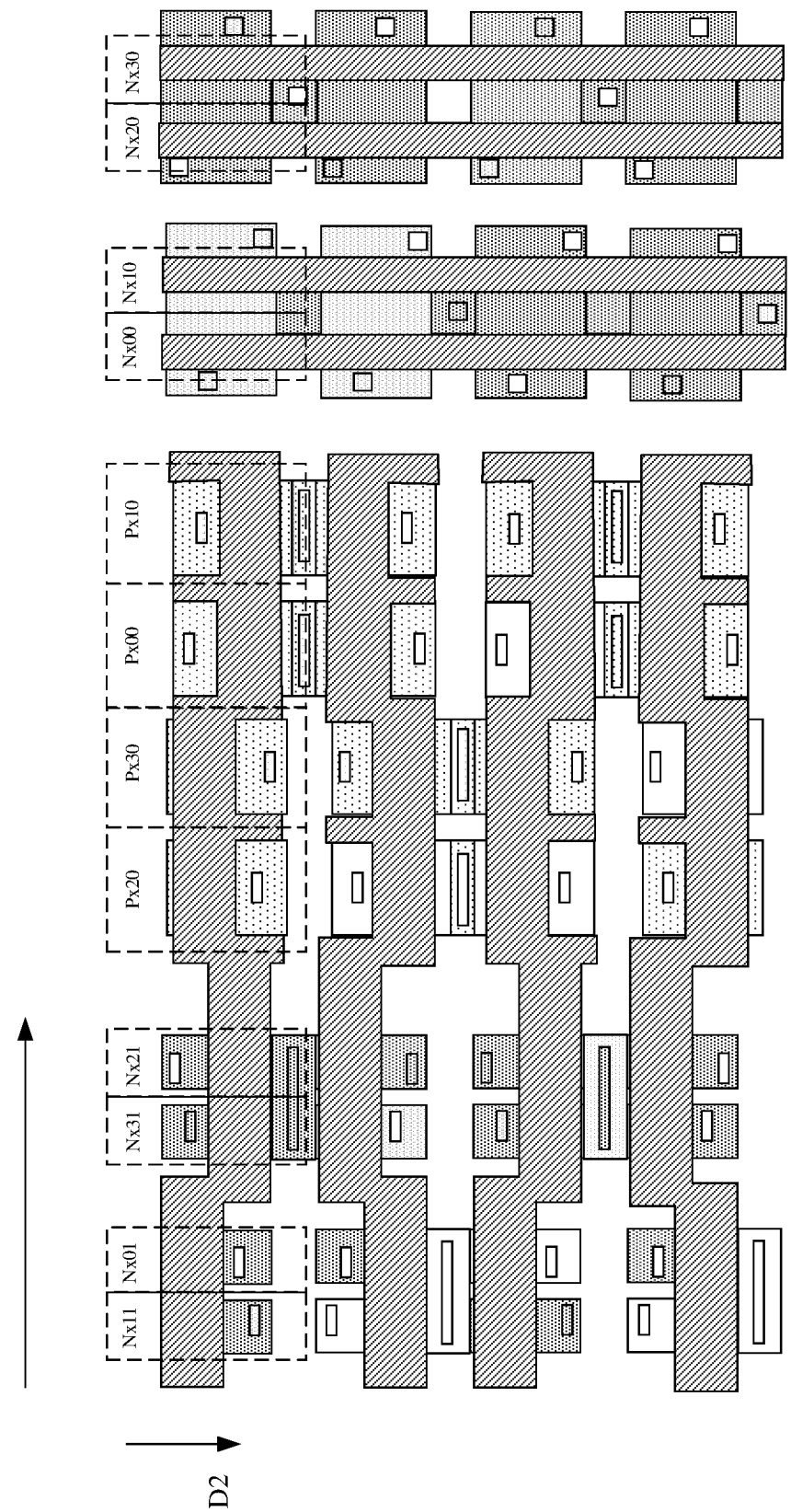

In some embodiments, referring to FIG. 13, in the first extension direction D1, the sixth NMOS transistor Nx11, the fourth NMOS transistor Nx01, the tenth NMOS transistor Nx31, the eighth NMOS transistor Nx21, the fourth PMOS transistor Px20, the fifth PMOS transistor Px30, the second PMOS transistor Px00, the fourth PMOS transistor Px10, the third NMOS transistor Nx00, the fifth NMOS transistor Nx10, the seventh NMOS transistor Nx20, and the ninth NMOS transistor Nx30 are arranged in sequence. Moreover, a plurality of word line drivers having the same arrangement are arranged side by side in the second extension direction D2 to constitute the semiconductor structure.

Figure 14:
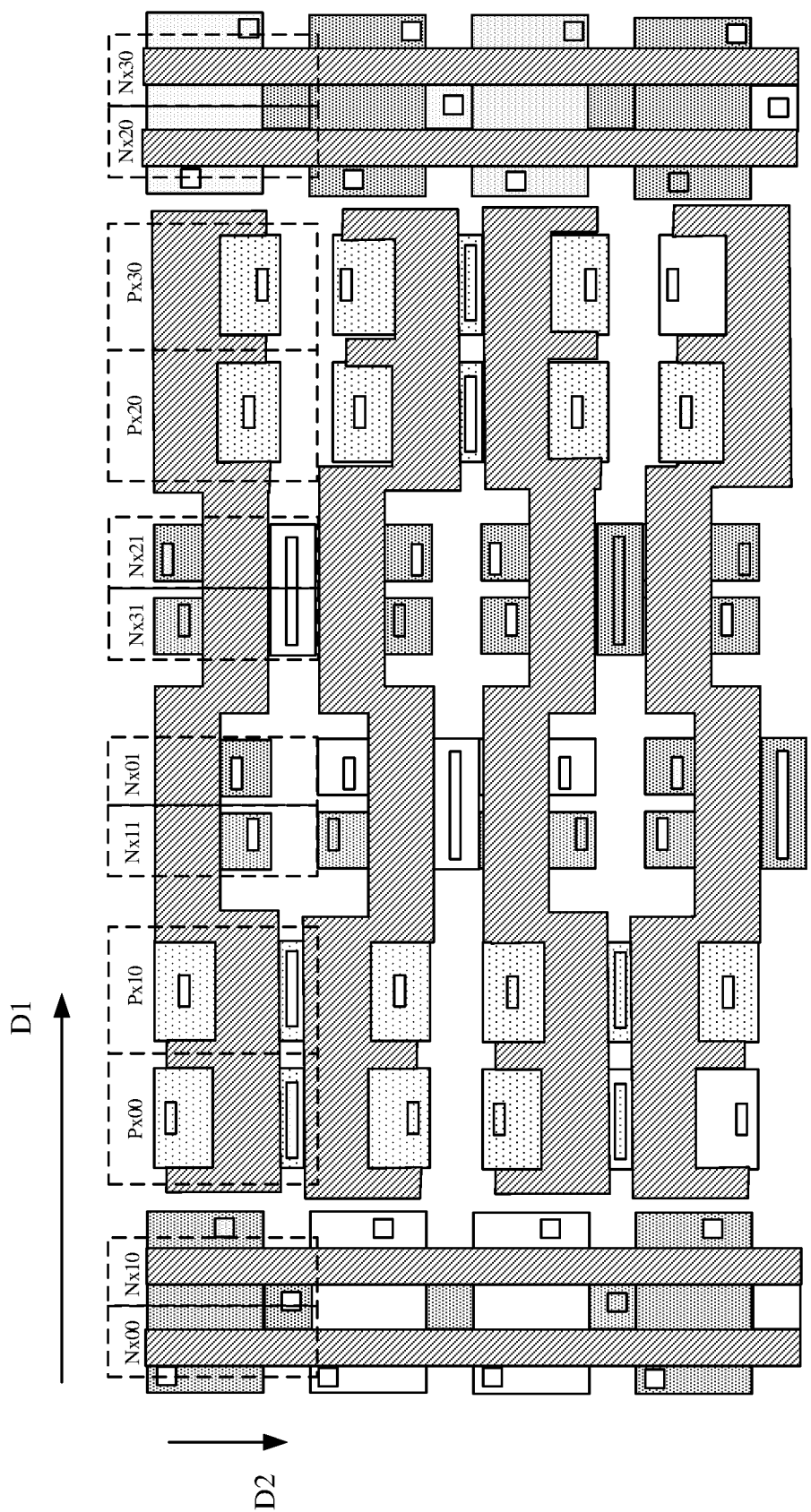

In some embodiments, referring to FIG. 14, in the first extension direction D1, the third NMOS transistor Nx00, the fifth NMOS transistor Nx10, the second PMOS transistor Px00, the fourth PMOS transistor Px10, the sixth NMOS transistor Nx11, the fourth NMOS transistor Nx01, the tenth NMOS transistor Nx31, the eighth NMOS transistor Nx21, the fourth PMOS transistor Px20, the fifth PMOS transistor Px30, the seventh NMOS transistor Nx20, and the ninth NMOS transistor Nx30 are arranged in sequence. Moreover, a plurality of word line drivers having the same arrangement are arranged side by side in the second extension direction D2 to constitute the semiconductor structure.

Figure 15:
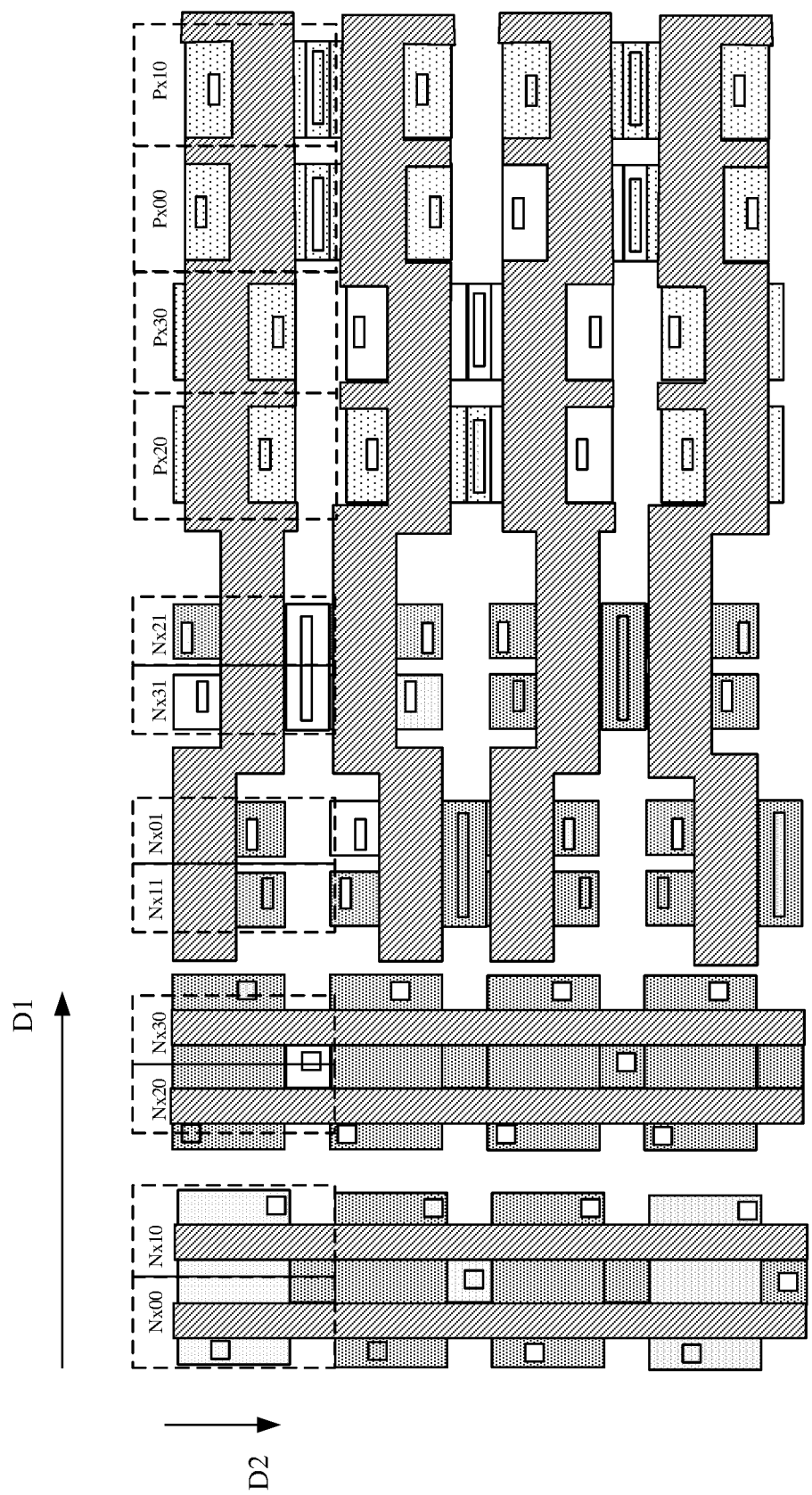

In some embodiments, referring to FIG. 15, in the first extension direction D1, the third NMOS transistor Nx00, the fifth NMOS transistor Nx10, the seventh NMOS transistor Nx20, the ninth NMOS transistor Nx30, the sixth NMOS transistor Nx11, the fourth NMOS transistor Nx01, the tenth NMOS transistor Nx31, the eighth NMOS transistor Nx21, the fourth PMOS transistor Px20, the fifth PMOS transistor Px30, the second PMOS transistor Px00, and the fourth PMOS transistor Px10 are arranged in sequence. Moreover, a plurality of word line drivers having the same arrangement are arranged side by side in the second extension direction D2 to constitute the semiconductor structure.

Figure 16:
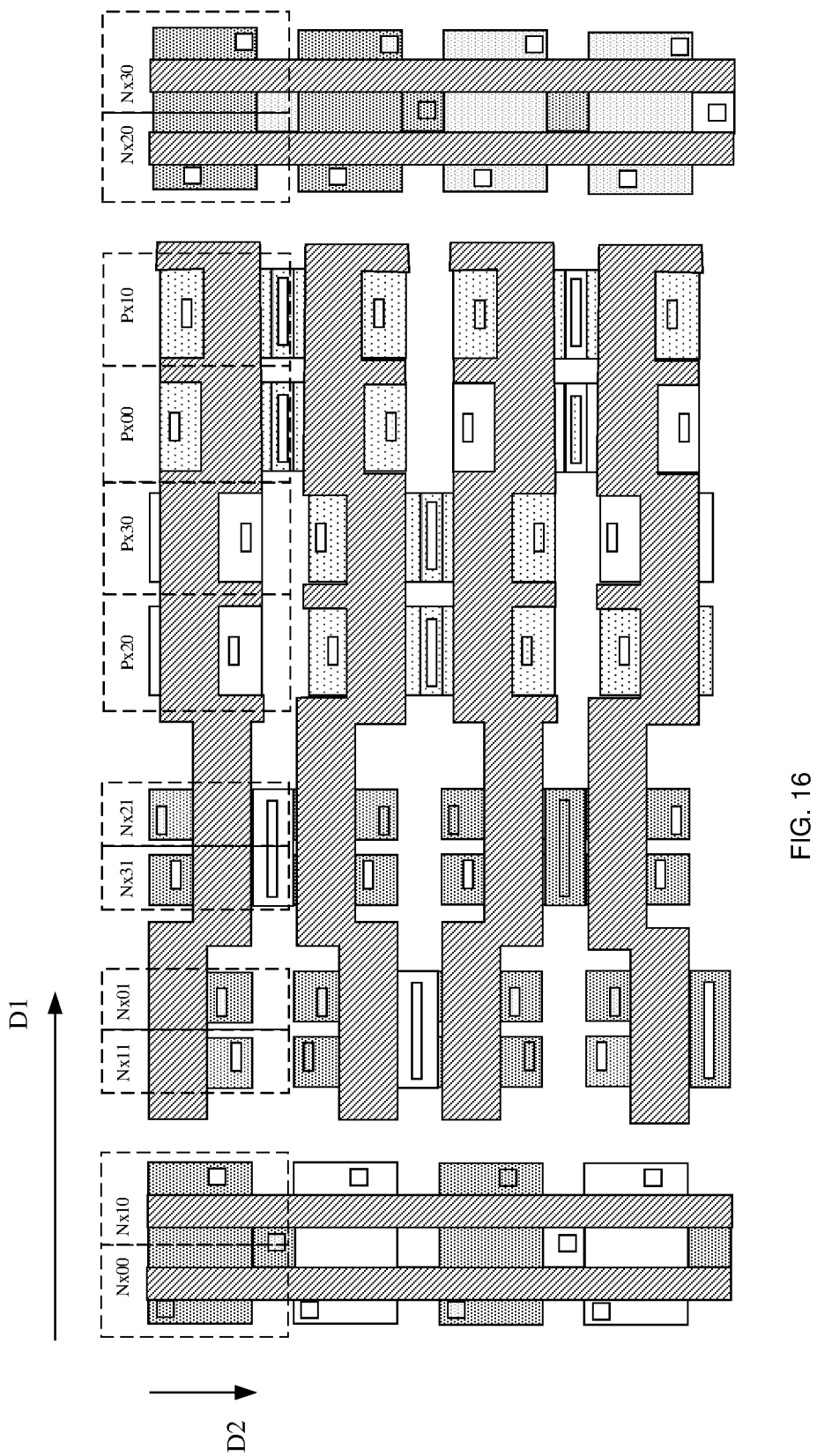

In some embodiments, referring to FIG. 16, in the first extension direction D1, the third NMOS transistor Nx00, the fifth NMOS transistor Nx10, the sixth NMOS transistor Nx11, the fourth NMOS transistor Nx01, the tenth NMOS transistor Nx31, the eighth NMOS transistor Nx21, the fourth PMOS transistor Px20, the fifth PMOS transistor Px30, the second PMOS transistor Px00, the fourth PMOS transistor Px10, the seventh NMOS transistor Nx20, and the ninth NMOS transistor Nx30 are arranged in sequence. Moreover, a plurality of word line drivers having the same arrangement are arranged side by side in the second extension direction D2 to constitute the semiconductor structure.

The present disclosure provides a new word line driver array. By adjusting the side-by-side arrangement direction and channel direction of the NMOS transistors, the electric performance and layout regularity of the word line driver array are promoted.

Figure 17:
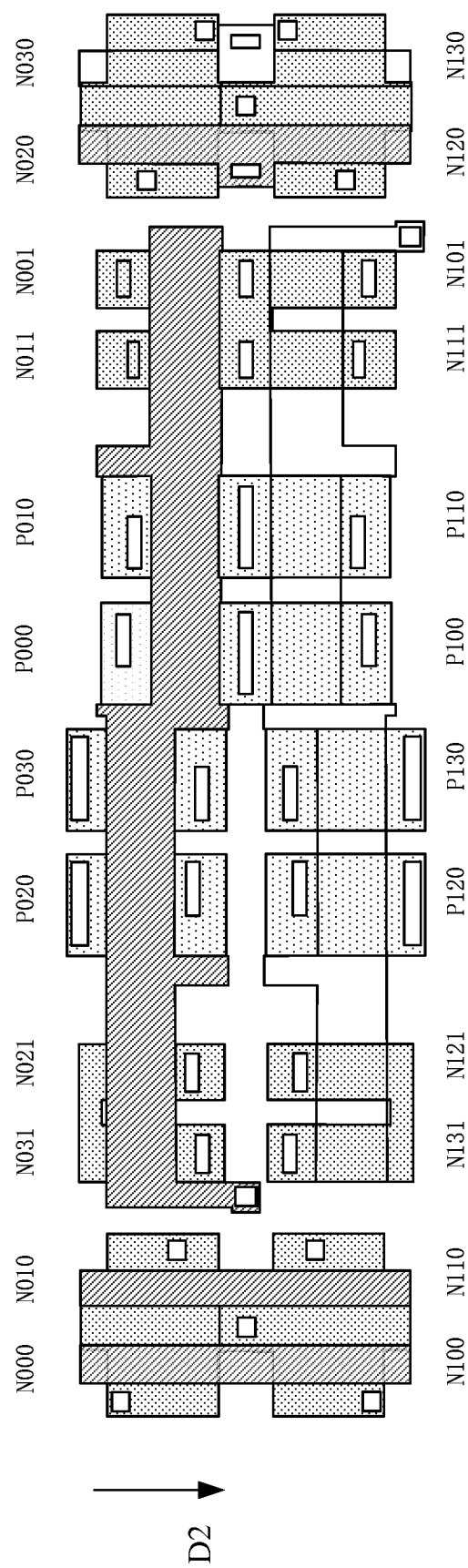
Figure 18:
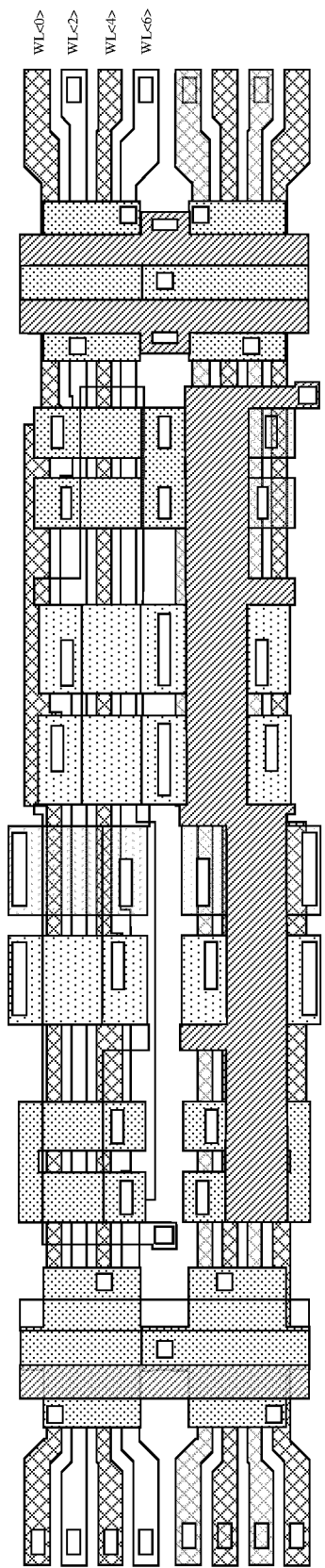

The embodiments of the present disclosure also provide a semiconductor structure. Referring to FIG. 17 and FIG. 18, FIG. 18 shows the word line on the basis of FIG. 17. The semiconductor structure includes: at least two of the word line driver arrays as described above marked as a first word line driver array and a second word line driver array. The first word line driver array and the second word line driver array are arranged side by side in a second extension direction D2. The first word line driver array includes a eleventh NMOS transistor N000, a twelfth NMOS transistor N010, a thirteenth NMOS transistor N020, and a fourteenth NMOS transistor N030. The second word line driver array includes a fifteenth NMOS transistor N100, a sixteenth NMOS transistor N110, a seventeenth NMOS transistor N120, and a eighteenth NMOS transistor N130. A gate of the eleventh NMOS transistor N000 is connected to a gate of the fifteenth NMOS transistor N100 and located on a first straight line; a gate of the twelfth NMOS transistor N010 is connected to a gate of the sixteenth NMOS transistor N110 and located on a second straight line; a gate of the thirteenth NMOS transistor N020 is connected to a gate of the seventeenth NMOS transistor N120 and located on a third straight line; a gate of the fourteenth NMOS transistor N030 is connected to a gate of the eighteenth NMOS transistor N130 and located on a fourth straight line; and the first straight line, the second straight line, the third straight line, and the fourth straight line are provided with the second extension direction and parallel to each other.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the word line driver, the word line driver array, and the semiconductor structure provided in the embodiments of the present disclosure, the zero PMOS transistor, the zero NMOS transistor, and the second NMOS transistor are arranged side by side in the first extension direction, the extension range of the first NMOS transistor and the extension range of the second NMOS transistor perpendicular to the first extension direction are enlarged, and under overall miniaturization of the word line driver, if the channel direction of the first NMOS transistor and the channel direction of the second NMOS transistor are perpendicular to the first extension direction, the channel length of the first NMOS transistor and the channel length of the second NMOS transistor may be extended, thereby improving the reliability of the NMOS transistors.

The invention claimed is:

1. A word line driver, comprising:
a first P-channel metal oxide semiconductor (PMOS) transistor, a first N-channel metal oxide semiconductor (NMOS) transistor, and a second NMOS transistor, the first PMOS transistor being provided with a gate connected to a gate of the second NMOS transistor and configured to receive a first control signal, a source configured to receive a second control signal, and a drain connected to a drain of the second NMOS transistor, the first NMOS transistor being provided with a gate configured to receive a second control complementary signal, and a drain of the first NMOS transistor and the drain of the second NMOS transistor being configured to be connected to a word line;
wherein the word line is provided with a first extension direction, and the first PMOS transistor, the first NMOS transistor, and the second NMOS transistor are arranged side by side in the first extension direction;
wherein a channel of the first PMOS transistor and a channel of the second NMOS transistor are provided with a second extension direction, and the second extension direction is perpendicular to the first extension direction.

2. The word line driver according to claim 1, wherein a channel of the first NMOS transistor is provided with the first extension direction.

3. The word line driver according to claim 2, wherein the first PMOS transistor is located between the first NMOS transistor and the second NMOS transistor.

4. The word line driver according to claim 2, wherein the second NMOS transistor is located between the first NMOS transistor and the first PMOS transistor.

5. The word line driver according to claim 2, wherein one side edge of the drain of the first NMOS transistor is flush with one side edge of the drain of the second NMOS transistor distant from the gate of the second NMOS transistor.

6. The word line driver according to claim 5, wherein in a second extension direction perpendicular to the first extension direction, a width of the drain of the first NMOS transistor is equal to a sum of a width of the gate of the second NMOS transistor and a width of the drain of the second NMOS transistor, and the other side edge of the drain of the first NMOS transistor is flush with one side edge of the gate of the second NMOS transistor distant from the drain of the second NMOS transistor.

7. A word line driver array, comprising:
at least two of the word line drivers according to claim 1 marked as a first word line driver and a second word line driver, the first word line driver comprising a second PMOS transistor, a third NMOS transistor, and a fourth NMOS transistor, the second word line driver comprising a third PMOS transistor, a fifth NMOS transistor, and an sixth NMOS transistor, and the first word line driver and the second word line driver being arranged side by side in a first extension direction;
wherein a gate of the second PMOS transistor is connected to a gate of the third PMOS transistor and located on a first straight line parallel to the first extension direction, a gate of the fourth NMOS transistor is connected to a gate of the sixth NMOS transistor and located on the first straight line, and a gate of the third NMOS transistor and a gate of the fifth NMOS transistor are arranged in parallel.

8. The word line driver array according to claim 7, wherein a source of the third NMOS transistor is connected to a source of the fifth NMOS transistor, and a source of the fourth NMOS transistor is connected to a source of the sixth NMOS transistor.

9. The word line driver array according to claim 7, wherein a channel of the third NMOS transistor and a channel of the fifth NMOS transistor are provided with the first extension direction.

10. The word line driver array according to claim 8, further comprising: a third word line driver and a fourth word line driver, the third word line driver comprising a fourth PMOS transistor, a seventh NMOS transistor, and a eighth NMOS transistor; the fourth word line driver comprising a fifth PMOS transistor, a ninth NMOS transistor, and a tenth NMOS transistor; wherein, in the first extension direction, the third NMOS transistor, the fifth NMOS transistor, the tenth NMOS transistor, the eighth NMOS transistor, the fourth PMOS transistor, the fifth PMOS transistor, the second PMOS transistor, the third PMOS transistor, the sixth NMOS transistor, the fourth NMOS transistor, the seventh NMOS transistor, and the ninth NMOS transistor are arranged side by side.

11. The word line driver array according to claim 10, wherein a channel of the seventh NMOS transistor and a channel of the ninth NMOS transistor are provided with the first extension direction, and in the first extension direction, an orthographic projection of a drain of the third NMOS transistor, an orthographic projection of a drain of the fifth NMOS transistor, an orthographic projection of a drain of the seventh NMOS transistor, and an orthographic projection of a drain of the ninth NMOS transistor overlap.

12. The word line driver array according to claim 10, wherein in the first extension direction, the third NMOS transistor, the fifth NMOS transistor, the tenth NMOS transistor, the eighth NMOS transistor, the fourth PMOS transistor, the fifth PMOS transistor, the second PMOS transistor, the third PMOS transistor, the sixth NMOS transistor, the fourth NMOS transistor, the seventh NMOS transistor, and the ninth NMOS transistor are arranged in sequence.

13. The word line driver array according to claim 10, wherein in the first extension direction, the sixth NMOS transistor, the fourth NMOS transistor, the tenth NMOS transistor, the eighth NMOS transistor, the fourth PMOS transistor, the fifth PMOS transistor, the second PMOS transistor, the third PMOS transistor, the third NMOS transistor, the fifth NMOS transistor, the seventh NMOS transistor, and the ninth NMOS transistor are arranged in sequence.

14. The word line driver array according to claim 10, wherein in the first extension direction, the third NMOS transistor, the fifth NMOS transistor, the second PMOS transistor, the third PMOS transistor, the sixth NMOS transistor, the fourth NMOS transistor, the tenth NMOS transistor, the eighth NMOS transistor, the fourth PMOS transistor, the fifth PMOS transistor, the seventh NMOS transistor, and the ninth NMOS transistor are arranged in sequence.

15. The word line driver array according to claim 10, wherein in the first extension direction, the third NMOS transistor, the fifth NMOS transistor, the seventh NMOS transistor, the ninth NMOS transistor, the sixth NMOS transistor, the fourth NMOS transistor, the tenth NMOS transistor, the eighth NMOS transistor, the fourth PMOS transistor, the fifth PMOS transistor, the second PMOS transistor, and the third PMOS transistor are arranged in sequence.

16. The word line driver array according to claim 10, wherein in the first extension direction, the third NMOS transistor, the fifth NMOS transistor, the sixth NMOS transistor, the fourth NMOS transistor, the tenth NMOS transistor, the eighth NMOS transistor, the fourth PMOS transistor, the fifth PMOS transistor, the second PMOS transistor, the third PMOS transistor, the seventh NMOS transistor, and the ninth NMOS transistor are arranged in sequence.

17. A semiconductor structure, comprising:
at least two of the word line driver arrays according to claim 8 marked as a first word line driver array and a second word line driver array, the first word line driver array and the second word line driver array being arranged side by side in a second extension direction;
wherein the first word line driver array comprises a eleventh NMOS transistor, a twelfth NMOS transistor, a thirteenth NMOS transistor, and a fourteenth NMOS transistor; the second word line driver array comprises a fifteenth NMOS transistor, a sixteenth NMOS transistor, a seventeenth NMOS transistor, and a eighteenth NMOS transistor; a gate of the eleventh NMOS transistor is connected to a gate of the fifteenth NMOS transistor and located on a first straight line; a gate of the twelfth NMOS transistor is connected to a gate of the sixteenth NMOS transistor and located on a second straight line; a gate of the thirteenth NMOS transistor is connected to a gate of the seventeenth NMOS transistor and located on a third straight line; a gate of the fourteenth NMOS transistor is connected to a gate of the eighteenth NMOS transistor and located on a fourth straight line; and the first straight line, the second straight line, the third straight line, and the fourth straight line are provided with the second extension direction and parallel to each other.

\* \* \* \* \*